(12) United States Patent
Shao et al.

(10) Patent No.: US 8,627,248 B1
(45) Date of Patent: Jan. 7, 2014

(54) VERIFICATION FOR FUNCTIONAL INDEPENDENCE OF LOGIC DESIGNS THAT USE REDUNDANT REPRESENTATION

(75) Inventors: Yun Shao, Portland, OR (US); Alexandre Ferreira Tenca, Beaverton, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/561,000

(22) Filed: Jul. 28, 2012

(51) Int. Cl.
*G06F 17/50* (2006.01)
*G06F 9/455* (2006.01)

(52) U.S. Cl.
USPC .......................................... 716/106; 716/107

(58) Field of Classification Search
USPC ................................................ 716/106, 107
See application file for complete search history.

(56) References Cited

U.S. PATENT DOCUMENTS

| | | | |
|---|---|---|---|
| 7,937,673 B1 | 5/2011 | Kurshan et al. | |
| 7,971,166 B2 | 6/2011 | Seigler et al. | |
| 8,042,078 B2 | 10/2011 | Paruthi et al. | |
| 8,079,000 B2 | 12/2011 | Koelbl et al. | |
| 8,127,261 B2 | 2/2012 | Auerbach et al. | |
| 8,156,462 B2 | 4/2012 | Moon | |
| 8,181,131 B2 | 5/2012 | Baumgartner et al. | |
| 2010/0235414 A1* | 9/2010 | Huang et al. .................. | 708/207 |
| 2011/0225220 A1* | 9/2011 | Huang et al. .................. | 708/207 |
| 2011/0231468 A1* | 9/2011 | Amin et al. .................... | 708/620 |
| 2011/0307848 A1 | 12/2011 | Yeung et al. | |
| 2012/0011187 A1* | 1/2012 | Mohamed et al. ............ | 708/523 |

* cited by examiner

*Primary Examiner* — Jack Chiang
*Assistant Examiner* — Magid Dimyan
(74) *Attorney, Agent, or Firm* — Adams Intellex, PLC

(57) ABSTRACT

Computer-implemented techniques are disclosed for verifying functional independence of logic designs that make use of redundant representations. Initially, the design of a logic component is obtained. Two representations of the component are computed, one in redundant form and another in non-redundant form. A randomness factor based on a time-varying value is injected into the second representation. The value from the second form is then constrained to the context of the logic component within a digital system. It is then possible to analyze the component using the first deterministic representation and the constrained second representation. This analysis allows verification of the component with downstream logic.

28 Claims, 5 Drawing Sheets

VERIFICATION FOR FUNCTIONAL INDEPENDENCE OF LOGIC DESIGNS THAT USE REDUNDANT REPRESENTATION

FIELD OF INVENTION

This application relates generally to computer-implemented design analysis of logic designs and more particularly to verification of logic designs that make use of redundant representations.

BACKGROUND

The design of modern electronic systems is a highly challenging and time-consuming task. The density and complexity of the systems demand that the design process yields functionally correct hardware in a timely and cost effective manner. Careful design consideration is required to ensure proper operation, yet such consideration is too difficult and too time consuming to be viable as current methods do not scale effectively to large electronic systems. That is, detailed design analysis is not practical for designs comprising thousands or even millions of devices. Instead, it is highly desirable to select components from libraries of design components that may then be reused in a wide and flexible range of circuit applications. Components from libraries are used routinely in the design and implementation of electronic systems. Customers may supplement a vendor's design library by providing specialty components meticulously designed to that customer's specifications. Therefore, the ultimate design objective is connecting components from various design libraries functioning properly in the particular systems for which they were selected.

In an electronic system, the operation of a given library component in situ is directly dependent on how and where the component is implemented within the system. A priori knowledge of the actual operation of the component is in many cases not possible because the physical implementation or layout of the component is determined by synthesis constraints and directly influence the system's functionality. The component and its encompassing system must meet or exceed key design and architectural criteria in order to function properly. These criteria typically specify systems that are highly reliable, provide high performance, are power efficient, and may be adapted to a variety of applications areas. Thus the ability of the system to properly function with any implementation of a particular component is critical. As noted, detailed analysis of the library components within the digital system is not feasible due to the exorbitant computational and time costs, so novel, more efficient methods must be used to validate the design and thus ensure that it will operate as specified independently of variations in the implementation of components. These methods must be computationally efficient, cost effective, and sufficiently accurate to provide detail about the operation of the logic cell in situ. Only then will validation of the logic designs be possible.

SUMMARY

An overall design includes numerous components. Components that perform arithmetic operations are widely used in many applications. A regular arithmetic component has its outputs in non-redundant form that can be represented with a binary vector $V(x)$ where x is the input vector of the component. The number of bits in $V(x)$ is the same as the size of the output operand. $V(x)$ is a deterministic function of the inputs of the component which means each bit of $V(x)$ is totally decided giving the input vector x. Besides regular non-redundant representations it is common for arithmetic components to use redundant representations on their outputs to enhance performance. To represent a non-redundant binary vector $V(x)$ in redundant form, m (m>1) binary vectors $\{V1, V2, \ldots, Vm\}$ are used. The non-redundant representation can be derived from the redundant representation by a reduction function $V(x)=R(\{V1, \ldots, Vm\})$. So each redundant representation has only one corresponding non-redundant representation. But multiple redundant representations exist for each non-redundant representation. The most commonly used redundant representation is carry-save (CS) format that contains two binary vectors called carry vector C and sum vector S. The reduction function for carry-save format consists in the sum of the two vectors with elimination of any carry out bit, which is $V(x)=(C+S) \bmod 2^n$, for a representation with n bits in each binary vector. Many arithmetic components can have their outputs in either binary format or carry-save format. An implication of using components with outputs in redundant forms is that the output vectors $\{V1, \ldots, Vm\}$ introduce polymorphism at the register transfer level (RTL) description. Polymorphism means that for a given input x there are multiple sets of $\{V1, \ldots, Vm\}$ that satisfy the reduction function $V(x)=R(\{V1, \ldots, Vm\})$. When translating the RTL design to a gate-level netlist, one of these representations will be used depending on the realization of the component. So the outputs of the component can change when its implementation is changed. It is important to assure the design functionality remains the same regardless of the implementation of the component that delivers $V(x)$ in redundant form. This problem cannot be addressed by conventional simulation or formal verification. Therefore this invention proposes new verification methodologies to solve it.

A computer-implemented method for design analysis is disclosed comprising: obtaining a design with a logic component with a redundant output; computing a first representation of the logic component output in redundant form; computing a second representation of the logic component output in non-redundant form which was derived from the redundant form; injecting a factor into the second representation to create a second redundant representation; constraining the second representation for the logic component output; simulating, with downstream logic, the first representation and the constrained second representation; and verifying the logic component with the downstream logic wherein the verifying comprises analyzing the logic component with the downstream logic using the first representation and the constrained second representation to provide a resulting analysis. The first representation may include a deterministic representation.

In embodiments, the factor which was injected may include a randomness factor. The randomness factor that is used for simulation and verification of the logic component may be constrained such that the randomness factor provides valid outputs from the logic component to the downstream logic. The factor may include an auxiliary stimulus supplied to the design. The first representation and the constrained second representation may be used to evaluate an expected result for the logic component. The logic component being verified may be part of a larger system and that logic component may operate within a context of the larger system. The logic component may be selected from a plurality of component implementations and the plurality of component implementations may possess different performance characteristics. The redundant form may comprise a carry-save logic form. The carry-save logic form may perform an arithmetic operation and wherein the arithmetic operation is performed using one or more redundant operands. The one or more redundant operands may be represented by a vector. The logic component may be an element of a design library. The logic component may be one of a plurality of circuit implementations contained within a design library and the plurality of circuit implementations may have specific operating characteristics. The logic component within a given design context may be verified to operate independently of upstream circuit elements and to operate independently of downstream circuit elements. The verifying may include formal verification. RTL source code behavior for the logic component may include dependence on circuit implementation and wherein RTL source code is ambiguous. The method may further comprise checking equivalence between the RTL source code and netlist for design of the logic component along with the downstream logic. The factor may include a randomness factor which is introduced into a verification process by: computing an output value based on a carry-save circuit form; subtracting from the output value a pseudo-random number; combining the pseudo-random number and the non-redundant output value to form a random redundant representation; constraining the output value to a context for the carry-save circuit form within a particular circuit implementation; selecting between values computed for a deterministic carry-save circuit form and the output value computed for a random redundant form of the carry-save circuit form; and verifying that the logic component operates correctly within the context of a system that contains it. The pseudo-random number may be taken at a random time causing values to change over time. Multiple implementations of the logic component may be verified. Verification of the logic component with carry-save outputs may be increased to cover a circuit implementation for the logic component within its particular design context. Design verification may include implementation independence and carry-save outputs produce their expected values. Logic design verification may be applied to simulation models of the logic component with carry-save outputs. The same concept can be expanded to any redundant representation besides carry-save. The invention can be applied to formal verification methods or simulation methods.

In embodiments, a computer system for design analysis may comprise: a memory which stores instructions; one or more processors coupled to the memory wherein the one or more processors are configured to: obtain a design with a logic component with output in redundant form; compute a first representation of the logic component in redundant form; compute a second representation of the logic component in non-redundant form which was derived from the redundant form; inject a factor into the second representation; constrain the second representation for the logic component; simulate, with downstream logic, the first representation and the constrained second representation; and verify the logic component with the downstream logic wherein the verifying comprises analyzing the logic component using the first representation and the constrained second representation to provide a resulting analysis. In some embodiments, a computer program product embodied in a non-transitory computer readable medium may comprise: code for obtaining a design with a logic component; code for computing a first representation of the logic component in redundant form; code for computing a second representation of the logic component in non-redundant form which was derived from the redundant form; code for injecting a factor into the second representation; code for constraining the second representation for the logic component; code for simulating, with downstream logic, the first representation and the constrained second representation; and code for verifying the logic component with the downstream logic wherein the verifying comprises analyzing the logic component using the first representation and the constrained second representation to provide a resulting analysis Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Modern electronic systems are typically constructed from components generated by a design automation tool or drawn from design libraries. The design automation tool proposes design component usage based on a wide range of criteria, so various component realizations are available. In some cases, component realization proposed by the design automation tool may already be in memory during the design process. Component libraries are comprised of components of varying sizes and complexities and often include multiple realizations of the same component. Each of the various realizations of the same component may provide certain advantages with respect to speed, area, power consumption, or other key design criteria. The component libraries may be provided by the electronic systems manufacturer, a customer requiring specialty components or custom-tuned components, or a combination thereof. These libraries contain many components that may be assembled in various ways and used to construct a wide range of electronic systems. In this invention, we assume that the components created by the design automation tool or available in a component library can be independently verified for correctness. The use of such components, particularly the components that provide outputs in redundant numeric form, can be problematic, and this invention provides a methodology to detect issues with their use.

The problem solved by this invention is based on the improper manipulation of the redundant numeric representation provided by the component with the output in redundant form in the global system context. For some realizations of this component, the system may operate correctly, but for others the system may fail. Consider the following example: one rounding strategy in digital systems consists in simply discarding the least significant bits of a binary representation. A designer may try to do the same on a CS representation, which means, discarding the least significant bits of vectors C and S. With this approach, a 2-bit truncation of a 6-bit CS representation (101100,000010), which corresponds to the binary vector (101100+000010) mod $2^6$=101110, would generate the CS representation (1011,0000), which corresponds to the binary vector (1011+0000) mod $2^4$=1011, that is a correct truncated representation of the truncated binary vector. Another realization of the same component that delivers the CS representation could deliver the following pair of vectors for the same binary value (101011,000011), corresponding to (101011+000011) mod $2^6$=101110, as desired.

The 2-bit truncation of the CS form would generate the pair (1010,0000), which corresponds to the binary vector 1010, and therefore, does not represent the corrected truncated binary vector. Thus, one realization of the component that delivers the CS output may allow the system to work properly, while other realization would not.

Figure 1:
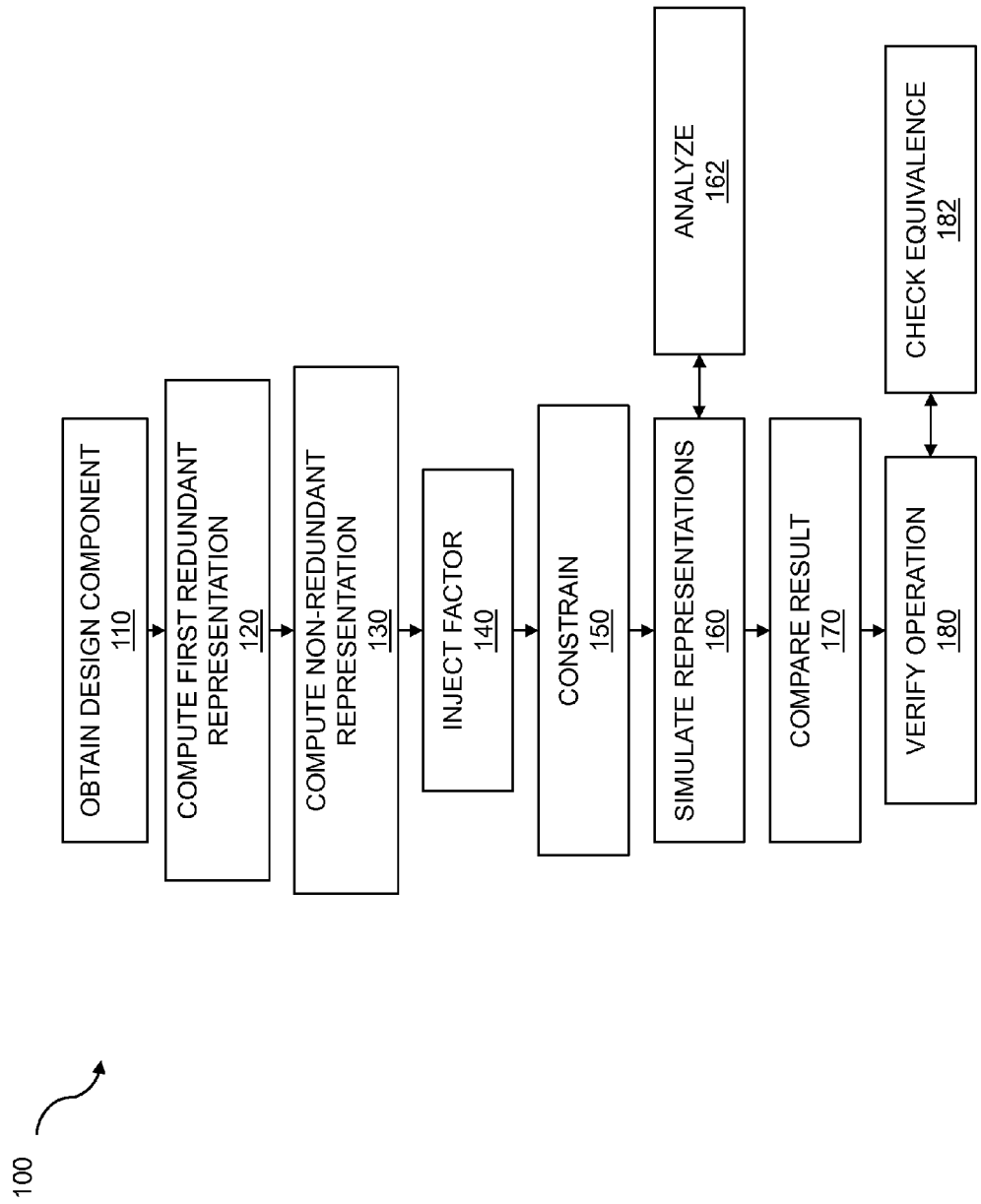
FIG. 1 is a flow diagram of a verification method.

FIG. 1 is a flow diagram of a verification method. A flow 100 is described for a computer-implemented method for verification for functional independence of logic designs that use redundant representation. The use of redundant numeric representation is a technique frequently used to accelerate arithmetic operations. The redundant representation of values is not as simple to work with as binary representation, but the need for performance usually pushes designers to more aggressively incorporate redundant representation in their designs. The use of redundant representation can increase the risk of improper operation. Functional verification of logic components and their surrounding systems is a critical step in the analysis of a logic design. The purpose of functional verification is to ensure that actual system specifications match the original design process plans. However, because modern logic systems are comprised of huge numbers of logic components, one cannot determine a priori proper component functionality until the design process has progressed sufficiently to understand the context of a given logic component within a system. That is, the functionality of a system may be evaluated only when all implementations of the logic component have been chosen. Previous logic design conventions based on "correct by construction" approaches no longer guarantee proper circuit function due to the wide range of implementations that can be dynamically created by synthesis tools. While the choice of one implementation of a logic component may result in a working system, the choice of a second implementation of the same logic component may result in a non-functioning system. This functional discrepancy may occur even though the choice of the second implementation was made for what seemed to be sound design reasons. Thus, a computationally efficient verification method which confirms proper operation of the actual system implementation is critical.

The flow 100 begins with obtaining a design with a logic component 110 that produces an output in redundant form. In embodiments, the design may be part of a larger system containing the logic component. In embodiments, the obtaining may include a logic component generated by a design automation tool, and the logic component may already be in memory during the design process. In embodiments, the logic component may be an element of a design library. The logic component may be selected from a plurality of component implementations in a design library wherein the plurality of component implementations possesses different performance characteristics. In embodiments, an electronics manufacturer may provide the logic component which may be drawn from the same or another design library. In embodiments, a customer who requires specialty components or components which have been specially turned may provide a logic component which may be drawn from another design library. In embodiments, the choice of logic component drawn from a design library may depend on performance, power consumption, area, and other critical design criteria.

The flow 100 continues with computing the output of the logic component in redundant form 120. The redundant form may comprise a carry-save form. In embodiments, the redundant form may comprise other forms of redundant numerical representation. The carry-save representation form may be used to represent the output of an arithmetic operation and the operation may be performed on one or more redundant operands. In embodiments, a redundant carry-save representation form may produce time-invariant redundant outputs for a given input value x. For example, a sample function f(x) in carry-save form may produce outputs Carry c(x) and Save s(x). The output of the logic component may be described as a deterministic representation. A deterministic carry-save representation is one that for a given input, always provides the same resulting carry-save number. For example, for a given n-bit logic function f(x) every time the input is set to x the function value is (c(x),s(x)), where c(x) and s(x) are also functions of x, and $f(x)=(c(x)+s(x)) \mod 2^n$. The carry-save representation of a number is based on a double value (composed of sum bits s(x) and carry bits c(x)).

The flow 100 continues with computing a second representation of the logic component in non-redundant form which was derived from the redundant form 130. The one or more redundant operands may be represented by a vector. In embodiments, obtaining a non-redundant form of f(x) may permit further operations upon the computed value of f(x). In embodiments, further computation on the function f(x) may be useful to a range of purposes including estimation, simulation, verification, and the like. The second representation may include a random carry-save representation we take advantage of the redundancy property of carry-save representation, and with time, we make the carry-save representation of a value change (similar to a stochastic process). For example, for the same n-bit function f(x), as presented before, when the input is set to x the function value is (r(t),p(x,t)), where r(t) is taken at random at time t, and p(x,t) is computed as $p(x,t)=\{f(x)-r(t) \mod 2^n\}$. Therefore, although the random carry-save representation is equivalent to the deterministic carry-save representation, which means, $\{c(x)+s(x)) \mod 2^n\}=\{(r(t)+p(x,t)) \mod 2^n\}$, the random representation changes with time for the same input value x. By using random variables it is possible to exercise designs that use f( ) with a less predictable picks from the set of possible carry-save representations of f(x), and therefore expose design issues. This technique can be applied at two different levels: simulation and formal verification.

The flow 100 continues with injecting a factor into the second representation 140. In embodiments, the injection of a factor 140 into the second, non-redundant form of a function f(x) is used to generate a different (redundant) representation of the same value f(x). Such injections may also serve a range of purposes including estimation, simulation, verification, and the like. In embodiments, the injection of a factor 140 into the second representation may permit a deeper insight into the in situ operation of the logic component, based on both the component's actual realization and its connections to downstream logic within a larger logic design. The factor which may be injected may include a randomness factor. The factor may include an auxiliary stimulus supplied to the design. In embodiments, a randomness factor may be based on a pseudo-random number that may be generated. In embodiments, the randomness factor may be generated at a random time in order to generate a time-varying pseudo-random number. The factor may include a randomness factor which may be introduced into the verification process by computing an output value which may be based on a carry-save circuit form; may subtract from the output value a pseudo-random number; may constrain the output value to a context for the carry-save circuit form within a particular circuit implementation; may select between the value computed for the deterministic carry-save circuit form and the output value computed for a redundant form of the carry-save circuit form; and may verify that the logic component operates correctly within the context of the system that contains it.

The flow 100 continues with constraining 150 the second representation for the logic component. Time-varying pseudo-random numbers may be generated that represent a wide range of values. The second representation of the output may be constrained to satisfy some desired property. The most common requirement is to allow direct sign extension on the redundant numeric representation, similarly to sign extension on two's complement representation in conventional binary system. For example, when using carry-save representation with 4 bits, bit-vectors that have the 2 most-significant bits of vectors (C,S) in the form (10,10) or (01,01) do not allow direct sign extension on these vectors. For this reason, the most significant bits of those representations must be transformed to (00,00) in the case of (10,10), and to (11,11) in the case of (01,01). With this type of transformation, the constrained second representation would allow direct sign extension. A simple digital circuit can be used to perform the proposed transformation on the second representation to generate the constrained second representation.

A more extensive example is: (1) take the CS representation (10101,10110) of a 5-bit binary vector (10101+10110) mod $2^5$=01011, which has the patterns that we described as having issues with sign extension; (2) sign extension of a single bit on the binary vector would provide the 6-bit vector 001011, where we just replicated the most significant (MS) bit, (3) sign extension of the vectors C and S of the CS representation would give (110101,110110) which corresponds to the 6-bit binary vector (110101+110110) mod $2^6$=101011; this value does not match the binary sign extended vector described in item (2). Therefore, as demonstrated, the simple sign extension applied to this particular CS representation is not correct. However, when we constrain the initial CS representation to (00101,00110), as proposed, it would still represent the 5-bit binary value (00101+00110) mod $2^5$=01011, the sign extended CS representation would be (000101,000110), and it would correctly represent the 6-bit sign-extended binary vector since (000101+000110) mod 26=001011.

The flow 100 continues with simulating, with downstream logic, the first representation and the constrained second representation 160. In embodiments, the simulating representations 160 comprise the simulation of a redundant representation and the simulation of a constrained second redundant representation into which a random factor was injected. In embodiments, a design automation tool may have simulated the design component extensively, and may have stored the design component in memory for use during the design process. In embodiments, the design component may have been simulated extensively before its inclusion in a design library and subsequent availability to system architects. In embodiments, the operation of the logic component may be influenced by a number of factors including but not limited to: other logic components driving its inputs, the physical structure of the design component altering its function, and the downstream logic components connected to and feeding from the design component's outputs. In embodiments, simulation of the design component, which may take into account the placement of the design component and the downstream logic within the overall logic design, is critical. In embodiments, the context of the design component within the overall design may be taken into account during the simulation process. Since changes to the response imposed on the logic component are not known a priori, it is not possible to rely simply on the component's response to a general simulation. In addition to simulation, verifying may comprise analyzing 162 the logic component using a first representation and the constrained second representation to provide a resulting analysis. In embodiments, the verifying may comprise various tests which exercise the logic component and the downstream logic connected to it.

The flow 100 continues with comparing results 170. A deterministic representation and a constrained second representation may be used to evaluate an expected result for the logic component. In embodiments, the constrained second representation may be time varying. In embodiments, the time-varying, constrained second representation may be compared to the deterministic representation. In embodiments, comparison between the first representation and the constrained second representation may determine whether the logic component is time-varying or time-independent. In embodiments, time-invariance may determine that the output of a logic component f(x) may still be dependent only on x and not upon time t. The verification consists in determining if the system output is equivalent (the same) for any type of redundant representation of the same value f(x).

The flow 100 continues with verification of the operation 180 of the logic component. The verifying may include formal verification. Logic design verification may be applied to the design that includes the logic component with carry-save outputs. The design is verified to operate independently of the implementation of a component with redundant outputs. In embodiments, a logic component from a design automation tool may be generated with connections to adjacent logic taken into account. A logic component and downstream logic generated by a design automation tool may already be in memory during the design process. In embodiments, logic components in a design library may have been designed such that they may be used independently, apart from their location within a system. However, such designs may be too large, too slow, too power inefficient, and the like. Logic design verification may be applied to simulation models of the logic component with carry-save outputs or any other redundant numeric representation. In embodiments, logic components, generated by a design automation tool may have redundant, carry-save outputs. In embodiments, logic components, obtained from a design automation tool or a design library, may deliver outputs in redundant numeric representation, carry-save outputs for example. Verification of any logic component with redundant representation may be performed where f( ) may represent the component with redundant representation. The function f(x) would then be described as $f(x)=Y=(V_1(x), V_2(x), \ldots, V_m(x))$, such that $Y=(\Sigma V_i(x))$ mod $2^n$ for i values in the range [1,m]. The same concept of random representation can be incorporated in this case by choosing n−1 $V_i$ values at random. In this case $\{V_1(t), V_2(t), \ldots, V_{m-1}(t)\}$ may be used and the final value may be calculated using $V_m(x,t)=(f(x)-\Sigma Vi(t))$ mod $2^n$, for i in the range [1,m−1]. In embodiments, values from the constrained second representation may be used to verify the operation of a logic component. Since the values of the constrained second representation are time varying, and since the values may be applied in addition to test values routinely generated, the increased number of test values may evaluate more of the connected logic component than was previously possible. Design verification may include implementation independence and assure design outputs that may produce their expected values with any component implementations. In embodiments, the method for design analysis may further comprise checking equivalence 182 between RTL source code and netlist for design of the logic component along with downstream logic. Multiple implementations of the logic component may be verified. Various steps in the flow 100 may be changed in order, repeated, omitted, or the like without departing from the disclosed inventive concepts. Various embodiments of the flow 100 may be included in a computer program product embodied in a non-transitory computer readable medium that includes code executable by one or more processors.

Figure 2:
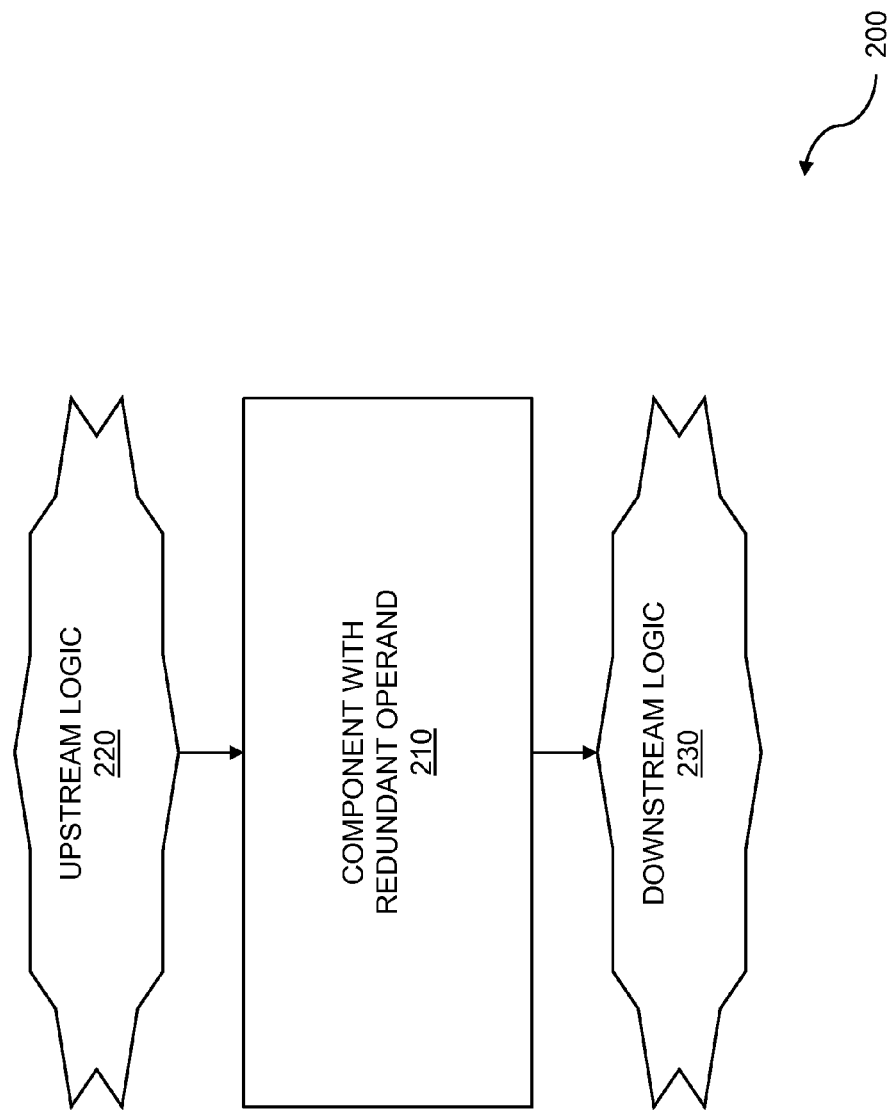
FIG. 2 is a diagram showing upstream and downstream logic.

FIG. 2 is a diagram showing upstream and downstream logic 200. The inputs to a component with redundant operand 210 may be driven by upstream logic 220, while in turn, the outputs of this component 210 may drive the inputs of downstream logic 230. In some embodiments, the component 210 may be a carry-save redundant form, while in other embodiments the component 210 may be one of other redundant forms. The verifying of a logic component with downstream logic may further comprise comparing the results from simulating the first representation and the second representation. In embodiments, RTL source code behavior for the system may include dependence on circuit implementation of the internal components with redundant outputs and wherein the RTL code is ambiguous. As a result, some embodiments may include a method for checking equivalence between the RTL source code and a transformed RTL code that includes the proposed method to randomize the redundant representation used as output in all components with redundant output. To do so, a pseudo-random number may be taken at a random time causing the value to change over time, or a totally free variable.

Figure 3:
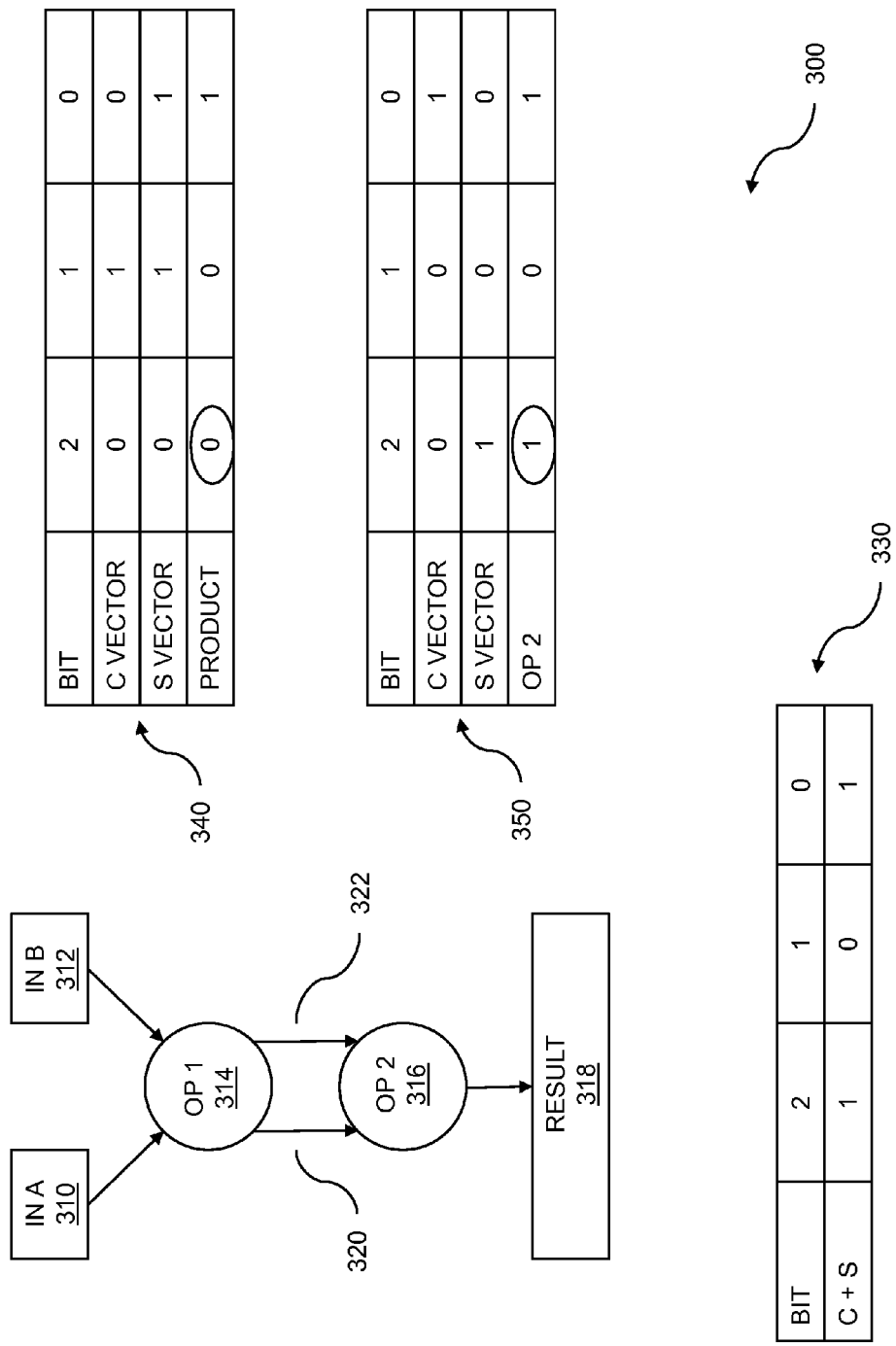
FIG. 3 is a diagram showing failing gate-level implementation.

FIG. 3 is a diagram showing failing carry-save representation manipulation. A diagram 300 is shown for a logic system which may be implemented according to various design conditions. In embodiments, a logic component may be part of a larger logic design.

A logic component OP 1 314 may have two inputs, IN A 310 and IN B 312. In embodiments, OP 1 314 delivers an output in redundant form. The redundant form may comprise a carry-save form. OP 1 314 produces two outputs, 320 and 322. In embodiments, OP 1 314 is in carry-save form and may produce vectors Carry 320 and Save 322. For the example shown, Carry 320 may be a value represented in three bits, and Save 322 may be a value represented in three bits. In various embodiments, carry and save may be represented by other bit lengths. A second operation OP 2 316 is shown in the example. OP 2 316 takes as inputs 320 and 322 and produces a Result 318. This result 318 discards the (two) least significant bits of the output provided by OP 1. One or more of the redundant operands may be represented by a single binary vector (PRODUCT). In this example, because Carry 320 and Save 322 are each three-bit numbers with the Result 318 also being three-bit numbers. In embodiments, other bit lengths may represent Carry 320, Save 322, and Result 318 values. For this example, OP 2 was incorrectly designed (incorrectly described in RTL), and the least significant 2 bits of 320 and 322 are discarded.

Table 330 is an example table showing the non-redundant representation (binary value) of the output provided by OP1 314 as (C+S). Therefore, the correct operation of discarding the two least significant bits of the output of OP 1 would generate the bit value '1' at the bit position 2. In embodiments, three, or more bits, digits, and the like may be used to represent numbers of arbitrary size, with the number of bits comprising the Result 318 being larger that the numbers of bits comprising the IN A 310 and IN B 312.

Table 340 shows an example of the result computed by OP 2 316 for one possible carry-save representation of the binary value (101). Because the least significant 2 bits of Carry 320 and Save 322 vectors are discarded, the output of OP 2 316 provides the bit 0, as shown in table 340 instead of its expected value of 1. This means that the result (0) is not equal to the expected result (1), thus the implementation fails.

Table 350 shows an example of the result computed by OP 2 316 for another possible carry-save representation of the binary value (101). By discarding the least significant 2 bits of Carry 320 and Save 322 we still get the output of OP 2 generating a 1, equal to its expected value of 1. This means that the result (1) is equal to the expected result (1), thus the implementation succeeds. Therefore, for different implementations of OP1 314, OP2 316 may generate correct, sometimes correct, and sometimes incorrect results. The concept proposed in this disclosure detects this type of problem by exercising different representations for the redundant representation of OP 1 314, which has outputs composed of Carry 320 and Save 322.

Figure 4:
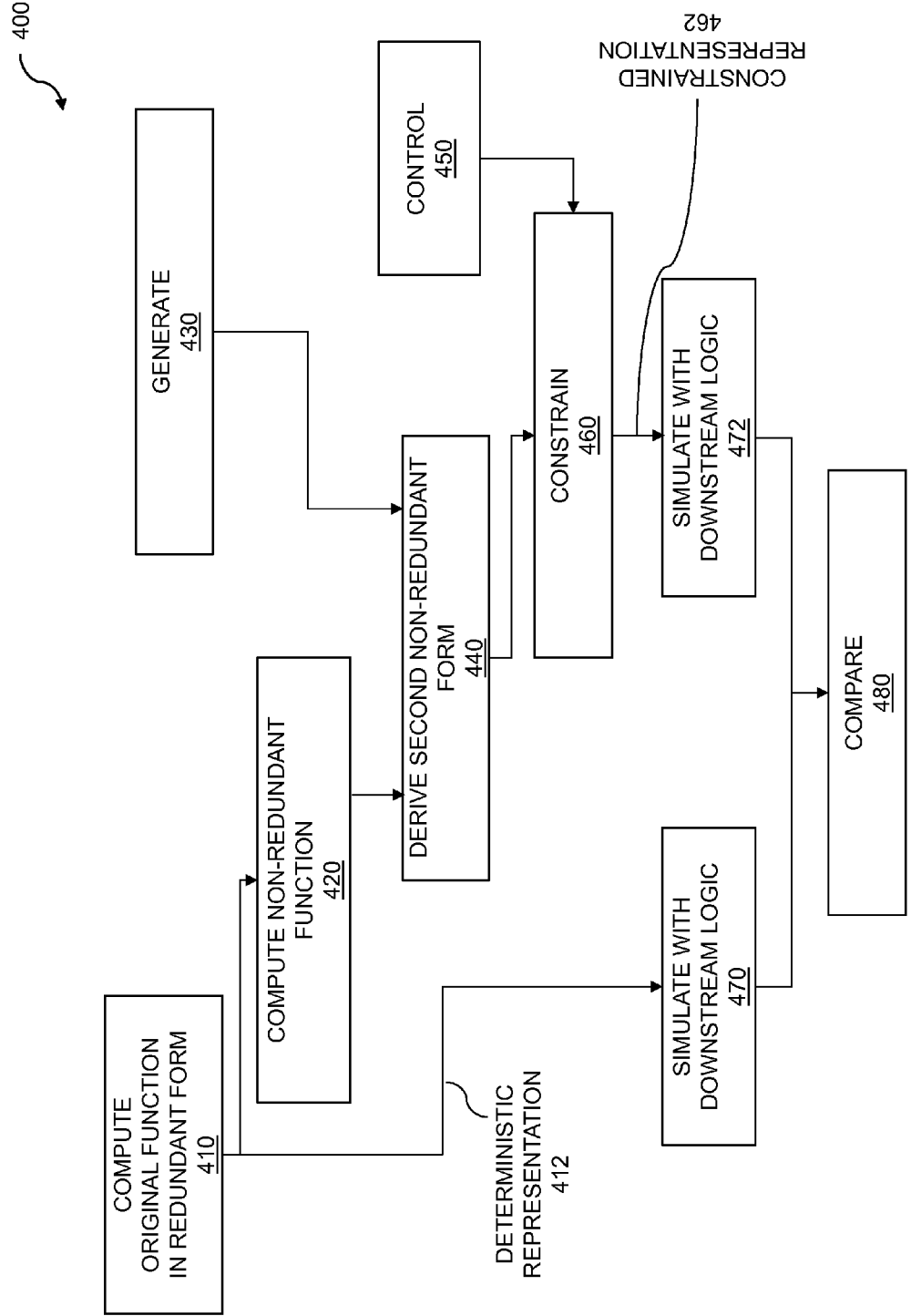
FIG. 4 is a diagram showing simulation flow.

FIG. 4 in a diagram showing simulation flow 400. Simulation and/or verification are critical steps in a successful logic design process. In embodiments, design simulation may be achieved by generating pseudo-random numbers which may be used as test vectors for a logic component. In some embodiments, test vectors may be generated elsewhere and may be injected into a logic component. However, the selection of test vectors appropriate to a given logic design may depend on the realization of the logic component and the downstream logic to which it is connected. In addition, detailed analysis is not feasible due to high computational requirements. Therefore, an effective and cost-effective testing scheme is highly desirable.

The flow 400 may comprise computing or obtaining a first representation 410 of the logic component in redundant form. The logic component may be described by RTL where operation actually depends on the implementation of a component with redundant output. The RTL code in this case is considered ambiguous. More formally, if a component described in RTL, implements a function G(a,b,c, . . . ) with a first implementation of a block; and if a second implementation of a block produces another function H where H(a,b,c, . . . )≠G(a, b,c, . . . ); then the RTL source code is ambiguous. As such, this RTL code is not a valid reference to be used for verification. The following sequence can help the formal verification to assure that the RTL reference code is a valid reference before the netlist generated by the synthesis tool is verified for equivalence against this RTL reference. The original logic function may be determined for a design with a logic component. The logic component may be part of a larger system and that logic component may operate within a context of a larger system. In some cases, a design automation tool may generate the logic component being verified. In other cases, the design component from the design automation tool may already be in memory during the design process. In still other cases, the logic component may be obtained from a design library. The logic component implementation may be one of a plurality of circuit implementations contained within a design library wherein the plurality of circuit implementations have specific operating characteristics.

The flow 400 may include computing a second representation of the logic component in non-redundant 420 form which was derived from the redundant form. The original logic function in redundant form 410 may produce redundant outputs carry and save. In order to manipulate the output of the function in its original form, the redundant terms carry and save may be recombined to generate the non-redundant representation. For example, carry c(x) and save s(x) may be recombined as $f(x)=(c(x)+s(x)) \bmod 2^n$, where f(x) is the binary representation of the same value provided in carry-save form as the pair (c(x),s(x)).

The flow 400 may comprise generating 430 a factor. The factor that may be injected into the second representation and may include a randomness factor. The factor 430 that is injected may include a randomness factor which is introduced into the verification process which computes an output value based on a carry-save circuit form; which may subtract from the output value a pseudo-random number; which may constrain the output value to a context for the carry-save circuit form within a particular circuit implementation; which may select between the value computed for the deterministic carry-save circuit form and the output value computed for a redundant form of the carry-save circuit form; and may verify that the logic component operates correctly within the context of the system that contains it. The factor which is used for simulation and verification may include an auxiliary stimulus supplied to the design.

The flow 400 may include injecting a factor into the second redundant representation. In embodiments, the factor may be used to introduce a change into the second non-redundant form 440. In embodiments, the change introduced into the second non-redundant form 440 may permit a more detailed simulation and verification of the original logic function. The primary concept is to inject a factor, in some cases a random value, in one of the vectors that form a carry-save representation, and derive the other vector from the non-redundant output of a module.

The flow 400 may comprise constraining the second representation for the output of the logic component. A control 450 may be placed into the flow 400 to activate the constraining 460. In embodiments, a time-variant factor injected into a second non-redundant form may trigger an output from a logic component not normally a valid input to downstream logic. In embodiments, the randomness factor that may be used for simulation and verification of the logic component may be constrained 460 such that the randomness factor may represent expected outputs from the logic component. In embodiments, the randomness factor that may be used for simulation and verification of the logic component may be constrained 460 such that the randomness factor may provide valid outputs from the logic component to the downstream logic.

The flow 400 may include simulating, with downstream logic, the first representation 470 and simulating, with downstream logic, the constrained second representation 472. The function of a logic component may be influenced by many factors including logic component representation, physical implementation, upstream logic, downstream logic, and the like. In embodiments a logic component may be simulated using downstream logic in order to determine whether the logic component generates valid output signals. In embodiments, simulation may be used to determine whether a particular implementation of a logic component—and the downstream logic connected to that logic component—may permit its proper operation. In embodiments, the flow may include verifying the logic component with the downstream logic wherein the verifying may comprise analyzing the design using the first deterministic representation 412 and analyzing a logic component with the constrained second representation 462 value to provide a resulting analysis.

The flow 400 may include comparing 480 simulation results with expected results from a correctly functioning logic component. In embodiments, expected results may be the expected outputs from a logic component. In some embodiments, baseline results may derive from simulation coverage. The deterministic first representation 412 and the constrained second representation 462 value may be used to determine an expected result for the logic component and a comparison made. For formal verification, when it is proven that the design functionality does not change for any carry-save representation of f(x) and any value x, then the conclusion is that the design does not depend on the particular implementation. The particular implementation includes the module that implements f( ), and in this way, assures that the implementation of f( ) generated by a synthesis tool will not affect design functionality. By transforming the reference model and showing that the transformed design is functionally equivalent to the original design, independent of the auxiliary input, it shows that the design is independent of variations in carry-save representations. Once this proof is accomplished, typical formal equivalence checking between the original source code and the netlist suffices to check for correctness of the RTL description of the design.

Various steps in the flow 400 may be changed in order, repeated, omitted, or the like without departing from the disclosed inventive concepts. Various embodiments of the flow 400 may be included in a computer program product embodied in a non-transitory computer readable medium that includes code executable by one or more processors.

Figure 5:
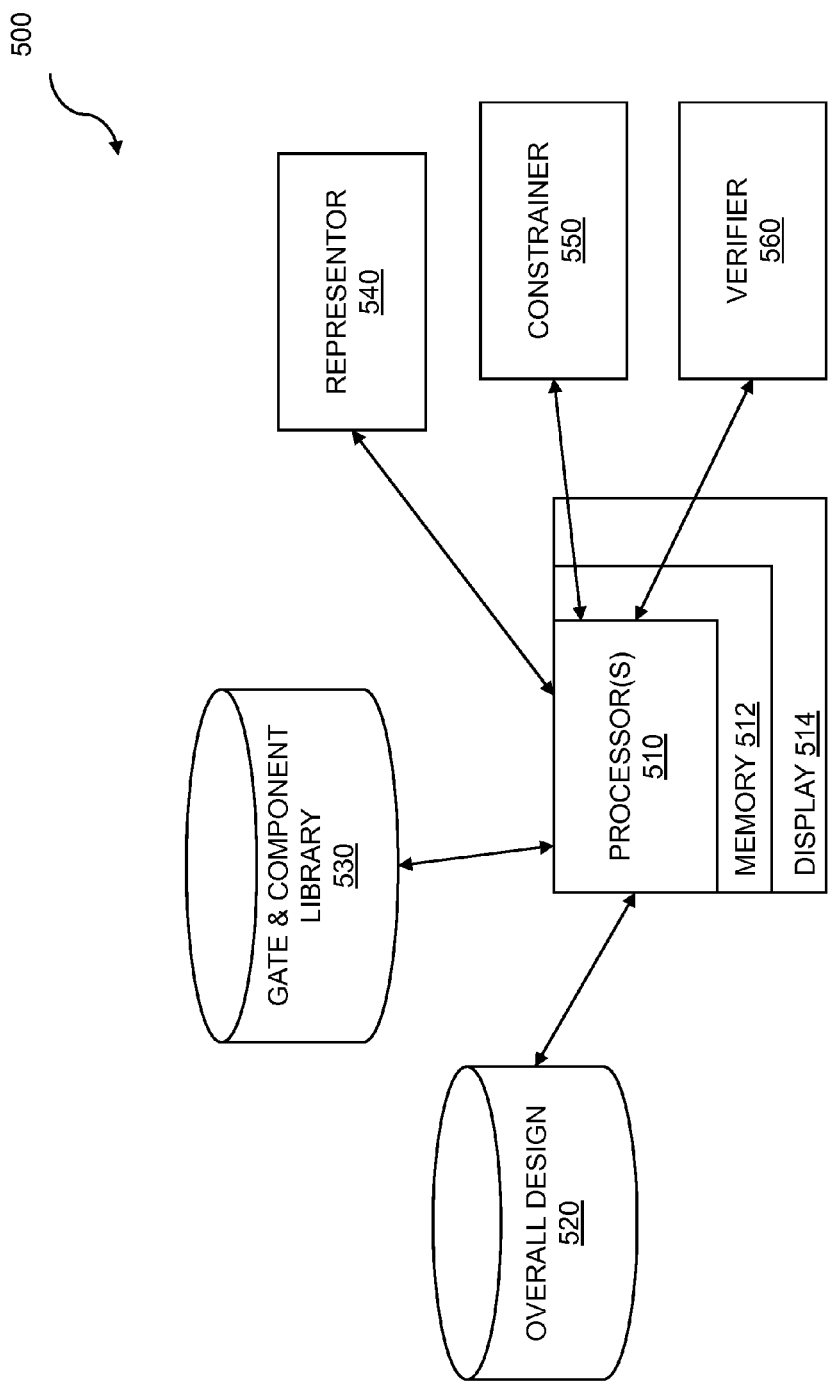
FIG. 5 is a system diagram for design verification.

FIG. 5 is a system diagram for design verification. The system 500 for may comprise one or more processors 510, a representor 540, a constrainer 550, and a verifier 560. In at least one embodiment, the representor, the constrainer, and the verifier functions may be accomplished by the one or more processors 510. The one or more processors may be coupled to a memory 512 which stores instructions, the overall design or a portion thereof, gate and circuit library information, system support data, intermediate data, analysis, help information, and the like. In embodiments, the one or more processors 510 may be coupled to an electronic display 514. The electronic display 514 may be any electronic display, including but not limited to, a computer display, a laptop screen, a net-book screen, a tablet computer screen, a cell phone display, a mobile device display, a remote with a display, a television, a projector, or the like.

The system 500 may load information on the overall design 520. The overall design information may contain various types of information about the electronic system which may be designed including an architectural description of the design. Design information may be in the form of Verilog™, VHDL™, SystemVerilog™, SystemC™, or other design language or other RTL representation. Similarly, system 500 may load gate and component library 530 information. In embodiments, the gate and component library 530 information may contain information about various logic components, alternative implementations of logic components, and the like. The gate and component library 530 may contain components which may be designed for specific applications and may be provided by a customer.

A representor 540 may be coupled to one or more processors 510. The representor 540 may determine a representation of a given gate or a given cell. In embodiments, a representation may be in a redundant form of a given function f(x) inside the design. A redundant representation may be in carry-save form. A carry-save form. for example, may represent a function f(x) through the equation f(x)=c(x)+s(x), and there are multiple ways to find pairs s(x) and c(x) that correspond to the same value f(x), for example f(x)=5 can be represented as (4,1), (2,3), (0,5) and so on. In embodiments, the design that uses a component, or multiple component that deliver outputs in redundant form may contain ambiguity. A design which contains ambiguity may be a form which generates a different output depending on the implementation of the component that implements f(x) and produces the output in redundant form, in this case as (c(x),s(x)). The representor 540 function is responsible to exercising the multiple (or all) possible redundant representations of f(x). In order to do that the representor 540 may use a pseudo-random number generator, or mathematically free variable (a variable that can take any value). In embodiments, a pseudo-random number generator may generate a wide range of numbers which may be used for design verification and other purposes. In embodiments, a representation may be in a non-redundant form. A non-redundant form may not require any special computation in order to determine f(x). In embodiments, the one or more processors 510 may accomplish the representor function.

A constrainer 550 may be coupled to one or more processors 510. The constrainer 550 may constrain the possible redundant representations of f(x). The possible redundant representation of f(x) are such that they accurately represent the range of valid redundant representations of f(x) that are expected as inputs to a given downstream logic. The one or more processors 510 may accomplish the constrainer function.

A verifier 560 may be coupled to one of more processors 510. The verifier 560 may verify whether a particular redundant representation of f(x), which has its outputs connected to downstream logic, may function as required by the context of the logic component within a system. Verification 560 may be based on pseudo-random numbers, auxiliary numbers or other inputs which may sufficiently exercise a logic component in order to confirm that it will operate as expected. The one or more processors 510 may accomplish the verifier function.

The system 500 may include computer program product embodied in a non-transitory computer-readable medium for design analysis. The computer program product may include but is not limited to: code for obtaining a design with a logic component; code for computing a first representation of the logic component in redundant form; code for computing a second representation of the logic component in non-redundant form which was derived from the redundant form; code for injecting a factor into the second representation; code for constraining the second representation for the logic component; code for simulating, with downstream logic, the first representation and the constrained second representation; and code for verifying the logic component with the downstream logic wherein the verifying may comprise analyzing the logic component using a first representation and the constrained second representation to provide a resulting analysis.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for design analysis comprising:
    obtaining a design with a logic component;
    computing, one or more processors, a first representation of the logic component in redundant form;
    computing a second representation of the logic component in non-redundant form which was derived from the redundant form;
    injecting a factor into the second representation where the factor includes a randomness factor which is introduced into a verification process by computing an output value based on a carry-save circuit form;
    constraining the second representation for the logic component;
    simulating, with downstream logic, the first representation and the constrained second representation; and
    verifying the logic component with the downstream logic wherein the verifying comprises analyzing the logic component with the downstream logic using the first representation and the constrained second representation to provide a resulting analysis.

2. The method of claim 1 wherein the first representation includes a deterministic representation.

3. The method of claim 1 wherein the randomness factor that is used for simulation and verification of the logic component is constrained such that the randomness factor provides valid outputs from the logic component to the downstream logic.

4. The method of claim 1 wherein the randomness factor that is used for simulation and verification of the logic component is constrained such that the randomness factor represents expected outputs from the logic component.

5. The method of claim 1 wherein the factor includes an auxiliary stimulus supplied to the design.

6. The method of claim 1 wherein the first representation value and the constrained second representation are used to evaluate an expected result for the logic component.

7. The method of claim 1 wherein the logic component being verified is part of a larger system and wherein that logic component operates within a context of the larger system.

8. The method of claim 1 wherein the logic component is selected from a plurality of component implementations and wherein the plurality of component implementations possess different performance characteristics.

9. The method of claim 1 wherein the redundant form comprises a carry-save logic form.

10. The method of claim 9 wherein the carry-save logic form performs an arithmetic operation and wherein the arithmetic operation is performed using one or more redundant operands.

11. The method of claim 10 wherein the one or more redundant operands are represented by a vector.

12. The method of claim 1 wherein the logic component is an element of a design library.

13. The method of claim 1 wherein the logic component is one of a plurality of circuit implementations contained within a design library and wherein the plurality of circuit implementations have specific operating characteristics.

14. The method of claim 1 wherein the logic component within a given design context is verified to operate independently of upstream circuit elements and to operate independently of downstream circuit elements.

15. The method of claim 1 wherein the verifying includes formal verification.

16. The method of claim 1 wherein RTL source code behavior for the logic component includes dependence on circuit implementation and wherein RTL source code is ambiguous.

17. The method of claim 16 further comprising checking equivalence between the RTL source code and netlist for design of the logic component along with the downstream logic.

18. The method of claim 1 wherein the factor includes: subtracting from the output value a pseudo-random number; constraining the output value to a context for the carry-save circuit form within a particular circuit implementation; selecting between values computed for a deterministic carry-save circuit form and the output value computed for a redundant form of the carry-save circuit form; and verifying that the logic component operates correctly within the context of a system that contains it.

19. The method of claim 18 wherein the pseudo-random number is taken at a random time causing values to change over time.

20. The method of claim 1 wherein multiple implementations of the logic component are verified.

21. The method of claim 1 wherein the verifying includes verification of design implementation independence of the logic component with the downstream logic.

22. The method of claim 1 wherein logic design verification is applied to simulation models of the logic component with carry-save outputs.

23. A computer system for design analysis comprising:
a memory which stores instructions;
one or more processors coupled to the memory wherein the one or more processors are configured to:
  obtain a design with a logic component;
  compute a first representation of the logic component in redundant form;
  compute a second representation of the logic component in non-redundant form which was derived from the redundant form;
  inject a factor into the second representation where the factor includes a randomness factor which is introduced into a verification process by computing an output value based on a carry-save circuit form;
  constrain the second representation for the logic component;
  simulate, with downstream logic, the first representation and the constrained second representation; and
  verify the logic component with the downstream logic wherein the verifying comprises analyzing the logic component with the downstream logic using the first representation and the constrained second representation to provide a resulting analysis.

24. The system of claim 23 wherein the randomness factor that is used for simulation and verification of the logic component is constrained such that the randomness factor provides valid outputs from the logic component to the downstream logic.

25. The system of claim 23 wherein the randomness factor that is used for simulation and verification of the logic component is constrained such that the randomness factor represents expected outputs from the logic component.

26. A computer program product embodied in a non-transitory computer readable medium for design analysis comprising:
  code for obtaining a design with a logic component;
  code for computing a first representation of the logic component in redundant form;
  code for computing a second representation of the logic component in non-redundant form which was derived from the redundant form;
  code for injecting a factor into the second representation where the factor includes a randomness factor which is introduced into a verification process by computing an output value based on a carry-save circuit form;
  code for constraining the second representation for the logic component;
  code for simulating, with downstream logic, the first representation and the constrained second representation; and
  code for verifying the logic component with the downstream logic wherein the verifying comprises analyzing the logic component with the downstream logic using the first representation and the constrained second representation to provide a resulting analysis.

27. The computer program product of claim 26 wherein the randomness factor that is used for simulation and verification of the logic component is constrained such that the randomness factor provides valid outputs from the logic component to the downstream logic.

28. The computer program product of claim 26 wherein the randomness factor that is used for simulation and verification of the logic component is constrained such that the randomness factor represents expected outputs from the logic component.

* * * * *